(12) United States Patent
Masuko et al.

(10) Patent No.: US 10,672,931 B2
(45) Date of Patent: Jun. 2, 2020

(54) SOLAR CELL

(71) Applicant: Panasonic Intellectual Property Management Co., Ltd., Osaka-shi, Osaka (JP)

(72) Inventors: Keiichiro Masuko, Osaka (JP); Wataru Shinohara, Fukushima (JP)

(73) Assignee: PANASONIC INTELLECTUAL PROPERTY MANAGEMENT CO., LTD., Osaka-shi, Osaka (JP)

( * ) Notice: Subject to any disclaimer, the term of this patent is extended or adjusted under 35 U.S.C. 154(b) by 0 days.

(21) Appl. No.: 16/143,769

(22) Filed: Sep. 27, 2018

(65) Prior Publication Data
US 2019/0027630 A1    Jan. 24, 2019

Related U.S. Application Data

(63) Continuation of application No. PCT/JP2017/001660, filed on Jan. 19, 2017.

(30) Foreign Application Priority Data

Mar. 29, 2016 (JP) ................. 2016-065390

(51) Int. Cl.
*H01L 31/047* (2014.01)
*H01L 31/0747* (2012.01)
(Continued)

(52) U.S. Cl.
CPC .. *H01L 31/0747* (2013.01); *H01L 31/022441* (2013.01); *H01L 31/03529* (2013.01); *H01L 31/03762* (2013.01); *Y02E 10/50* (2013.01)

(58) Field of Classification Search
None
See application file for complete search history.

(56) References Cited

U.S. PATENT DOCUMENTS 5,330,584 A    7/1994  Saga et al.
2012/0167978 A1*  7/2012  Shin ................ H01L 31/022441
                                                136/256
(Continued)

FOREIGN PATENT DOCUMENTS

JP        5-110121 A    4/1993
JP      2015-65219 A    4/2015
(Continued)

OTHER PUBLICATIONS

International Search Report w/English translation and Written Opinion in Japanese dated Apr. 18, 2017, issued in counterpart International Application No. PCT/JP2017/001660 (9 pages).

*Primary Examiner* — Jayne L Mershon
(74) *Attorney, Agent, or Firm* — Westerman, Hattori, Daniels & Adrian, LLP

(57) ABSTRACT

A solar cell is equipped with: a wafer; an n-type laminated body that is provided on the first main surface side of the wafer; and a p-type laminated body, which is provided on the first main surface side of the wafer such that the p-type laminated body is adjacent to the n-type laminated body in the X direction, and which extends in the Y direction. The wafer has: a lightly doped region that is doped to be n type; and a plurality of first main surface-side highly doped regions, which have an n-type dopant concentration that is higher than that of the lightly doped region, and which are provided between the lightly doped region and the p-type laminated body. The first main surface-side highly doped regions are discretely provided at intervals in the Y direction.

5 Claims, 9 Drawing Sheets

(51) Int. Cl.
*H01L 31/0376* (2006.01)
*H01L 31/0352* (2006.01)
*H01L 31/0224* (2006.01)

(56) References Cited

U.S. PATENT DOCUMENTS

| | | | |
|---|---|---|---|
| 2013/0112253 A1 | 5/2013 | Oh et al. | |
| 2013/0288423 A1 | 10/2013 | Takahama | |
| 2014/0083506 A1* | 3/2014 | Chen | H01L 31/068 136/261 |
| 2015/0083214 A1 | 3/2015 | Arimoto et al. | |

FOREIGN PATENT DOCUMENTS

| | | |
|---|---|---|
| WO | 2009/147890 A1 | 12/2009 |
| WO | 2012/090643 A1 | 7/2012 |

\* cited by examiner

SOLAR CELL

CROSS-REFERENCE TO RELATED APPLICATION

The present application is a continuation under 35 U.S.C. § 120 of PCT/JP2017/001660, filed Jan. 19, 2017, which is incorporated herein by reference and which claimed priority to Japanese Patent Application No. 2016-065390 filed Mar. 29, 2016. The present application likewise claims priority under 35 U.S.C. § 119 to Japanese Patent Application No. 2016-065390 filed Mar. 29, 2016, the entire content of which is also incorporated herein by reference.

TECHNICAL FIELD

The present disclosure relates to a solar cell.

BACKGROUND

Examples of a solar cell include a back junction type solar cell disclosed in Patent Literature 1. In this solar cell, both an n-type semiconductor layer and a p-type semiconductor layer are provided on a back surface facing a light receiving surface on which light is incident. This solar cell can eliminate an electrode on a light receiving surface side, and therefore the light receiving surface is widened, and an excellent power generation characteristic is exerted.

CITATION LIST

Patent Literature

Patent Literature 1: International Publication No. WO2012/090643

SUMMARY

Technical Problem

When a solar cell is shaded, a large reverse bias voltage is generated in the solar cell. The reverse bias voltage causes heat generation of the solar cell to deteriorate the solar cell. Therefore, suppression of such a reverse bias voltage is desired. However, even in a case where the reverse bias voltage can be suppressed, when a power generation characteristic is lowered significantly, the solar cell is unsuitable for practical use.

An object of the present disclosure is to provide a solar cell, in which it is possible to suppress a reverse bias voltage generated in a case where the solar cell is shaded, and a power generation characteristic is unlikely to be lowered.

Solution to Problem

A solar cell of an aspect of the present disclosure includes: a first conductive silicon wafer; a first conductive amorphous silicon layer that is provided on a first principal plane side of the first conductive silicon wafer, and extends in a first direction; and a second conductive amorphous silicon layer that is provided on the first principal plane side of the first conductive silicon wafer so as to be adjacent to the first conductive amorphous silicon layer in a second direction, and extends in the first direction, wherein the first conductive silicon wafer has: a lightly doped region that is doped into a first conductivity type; and a plurality of first principal plane side highly doped regions each having higher dopant concentration of the first conductivity type than the lightly doped region, and are provided between the lightly doped region and the second conductive amorphous silicon layer at an interval in the first direction.

Advantageous Effects of Invention

According to a solar cell of an aspect of the present disclosure, it is possible to suppress a reverse bias voltage generated in a case where the solar cell is shaped, and a power generation characteristic is unlikely to be lowered.

DESCRIPTION OF EMBODIMENTS

Figure 1:
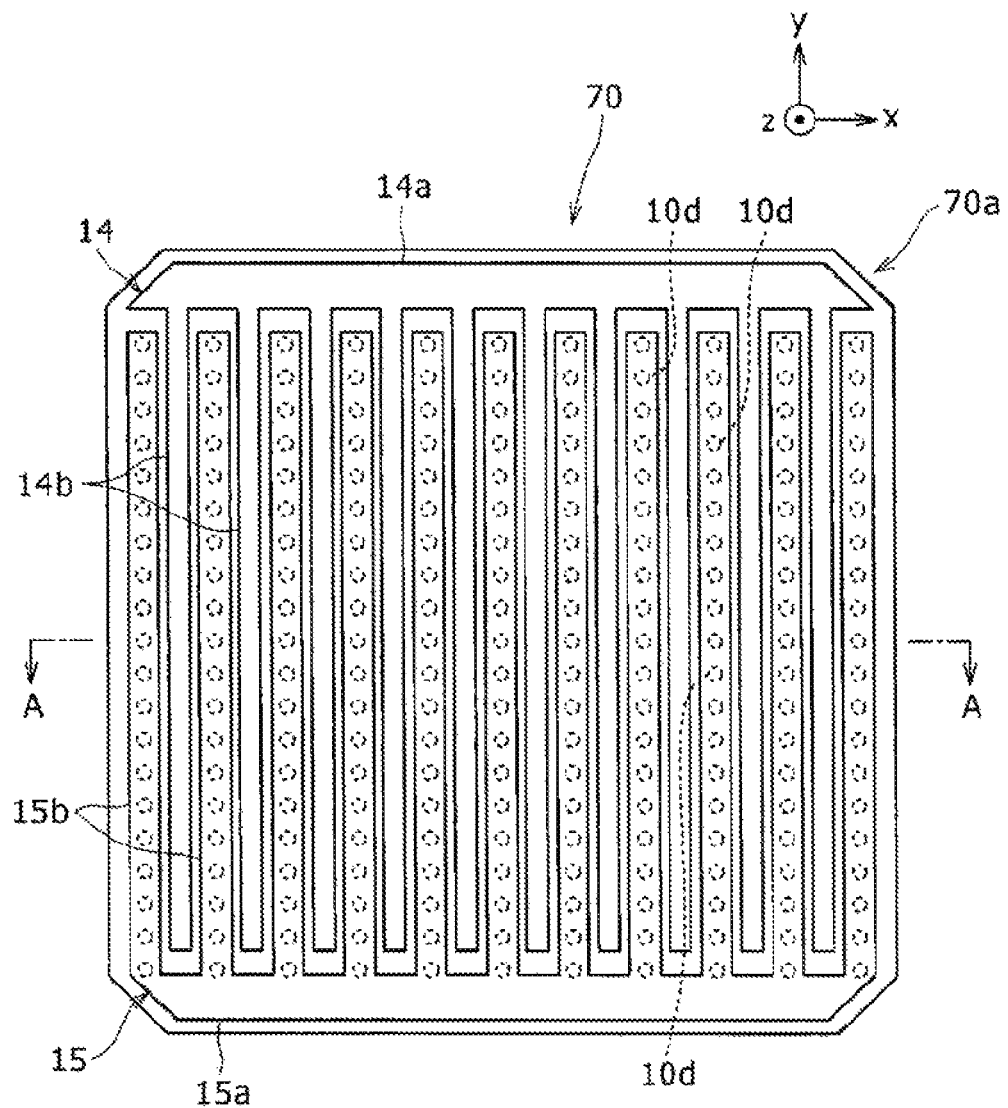
FIG. 1 is a plan view illustrating a solar cell according to an embodiment.

Hereinafter, an embodiment according to the present invention will be described in detail with reference to the attached drawings. In the following description, in a case where a plurality of embodiments, modifications or the like are included, it is assumed from the beginning that these characteristic portions are appropriately combined, and a new embodiment is constructed.

In the following embodiment, a light receiving surface 70b (refer to FIG. 2) means a principal plane on which light (sunlight) is mainly incident in a solar cell 70, and more specifically means a surface on which most of light incident in the solar cell 70 is incident. On the other hand, a back surface 70a (refer to FIG. 1 and FIG. 2) means another principal plane opposing the light receiving surface 70b.

In the following description, a Y direction as the first direction coincides with the extending direction of finger electrodes 14b, 15b (refer to FIG. 1), and an X direction as the second direction coincides with the extending direction of the bus bar electrodes 14a, 15a (refer to FIG. 1). Additionally, a Z direction coincides with the thickness direction (height direction) of a wafer 10.

FIG. 1 is a plan view illustrating the solar cell 70 according to the embodiment, and illustrates a structure of the back surface 70a of the solar cell 70. The solar cell 70 includes an n-side electrode 14 and a p-side electrode 15 provided on the back surface 70a. The n-side electrode 14 is formed in a comb-shape including the bus bar electrode 14a extending in the X direction, and a plurality of finger electrodes 14b extending in the Y direction. Similarly, the p-side electrode 15 is formed in a comb-shape including the bus bar electrode 15a extending in the X direction, and a plurality of finger electrodes 15b extending in the Y direction. The n-side electrode 14 and the p-side electrode 15 are formed such that comb teeth mesh with each other and are interposed between each other. Each of the n-side electrode 14 and the p-side electrode may be a busbarless-type electrode comprising only a plurality of finger electrodes and no bus-bar. In this case, the second direction is defined as the direction perpendicular to both the extending direction of the finger electrodes which coincides with the first direction, and the thickness direction of the wafer.

Figure 2:
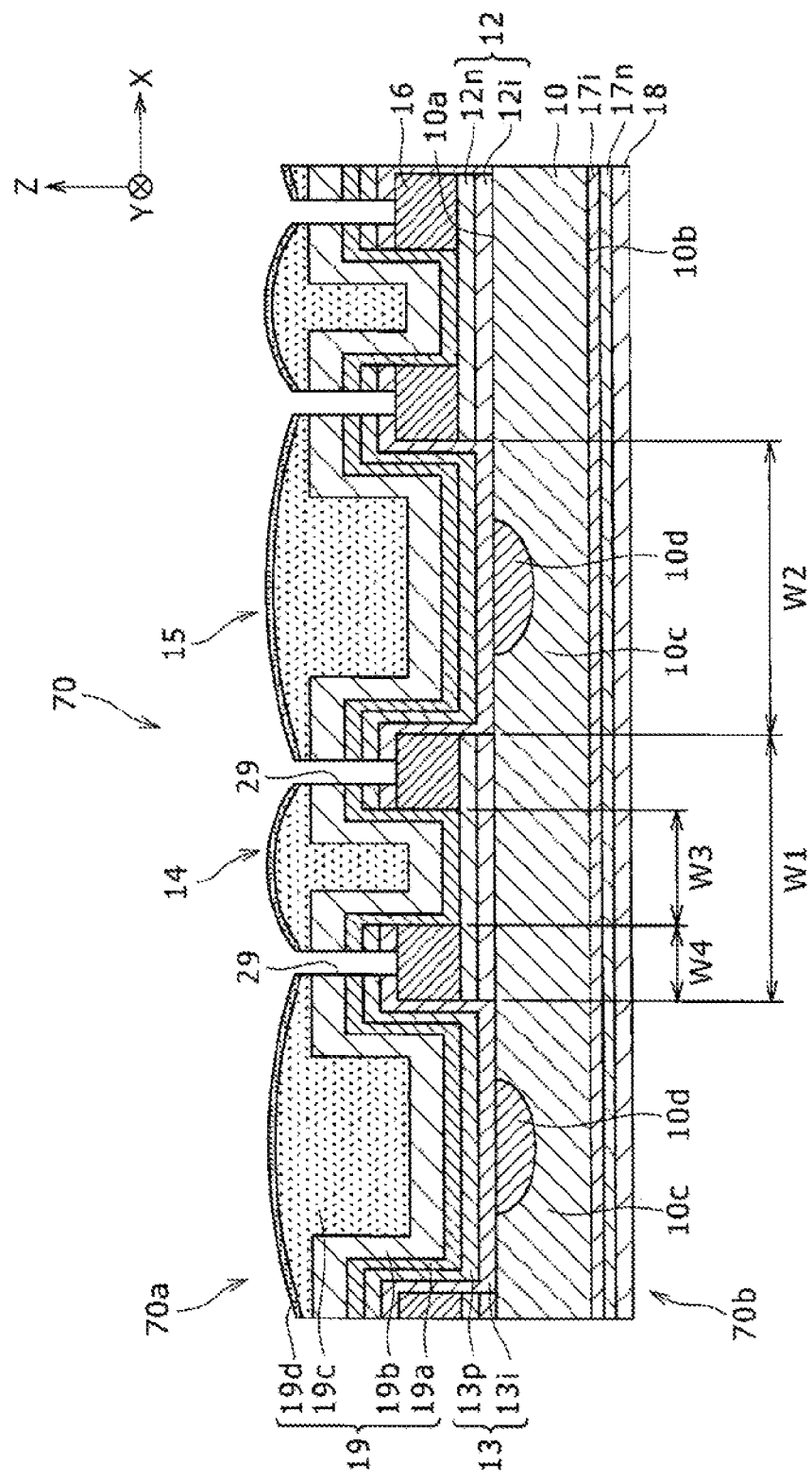
FIG. 2 is a sectional view illustrating a structure of the solar cell according to the embodiment, and a sectional view taken along an A-A line of FIG. 1.

FIG. 2 is a sectional view illustrating a structure of the solar cell 70 according to the embodiment, and illustrates an A-A line cross section of FIG. 1. The solar cell 70 includes an n-type single crystal silicon wafer 10 (hereinafter, simply referred to as a wafer) as a first conductive silicon wafer, an n-type laminated body 12 (laminated structure 12) as a first conductive amorphous silicon layer, a p-type laminated body 13 (laminated structure 13) as a second conductive amorphous silicon layer, a first insulating layer 16, an i-type layer 17i, an n-type layer 17n, a second insulating layer 18, and an electrode layer 19. The electrode layer 19 constitutes the n-side electrode 14 and the p-side electrode 15. In this embodiment, a case where the first conductivity type is the n-type, and the second conductivity type is the p-type will be described. However, in an embodiment or a modification, the conductivity type may be inverted, and the first conductivity type may be the p-type, and the second conductivity type may be the n-type.

The wafer 10 has a first principal plane 10a that is a surface on the back surface 70a side (upper side in the figure), and a second principal plane 10b that is a surface on the light receiving surface 70b side (lower side in the figure). The wafer 10 absorbs light incident on the second principal plane 10b, and generates electrons and positive holes as carriers. The wafer 10 is a flat plate shape as a whole, and has an n-type lightly doped region 10c doped with an n-type dopant as a first conductivity type, as a body portion. On the first principal plane side of the lightly doped region 10c, a plurality of first principal plane side highly doped regions 10d having higher n-type dopant concentration than the lightly doped region 10c are discretely provided. In this embodiment, the dopant concentration of the lightly doped region 10c is $1\times10^{15}/cm^3$ to $1\times10^{17}/cm^3$, and the dopant concentration of each first principal plane side highly doped region 10d is higher than the dopant concentration of the lightly doped region 10c, and is $1\times10^{18}/cm^3$ to $1\times10^{20}/cm^3$. The dopant concentration of each first principal plane side highly doped region 10d, and the dopant concentration of the lightly doped region 10c are not limited to these values, and the dopant concentration of each first principal plane side highly doped region 10d only needs to be higher than the dopant concentration of the lightly doped region 10c.

With reference to FIG. 2, the n-type laminated body 12 extends in the Y direction. The plurality of first principal plane side highly doped regions 10d are discretely arranged at intervals in the Y direction, as illustrated by dotted circles in FIG. 1. As illustrated in FIG. 2, in a cross section including the X direction and the Z direction, the first principal plane side highly doped regions 10d are each provided in a region which overlaps, in the Z direction, with a contact region where the p-type laminated body 13 is in contact with the wafer 10, and has a shape that is convex toward the second principal plane 10b and has the largest thickness at a central part in the X direction. That is, the first principal plane side highly doped regions 10d are each a region swelling inward from the first principal plane 10a. As described below, each first principal plane side highly doped region 10d is formed by being doped with an impurity in a spindle-shaped region as viewed from the Z direction (upper side), and is a region where the thickness of the center side of the spindle shaped region in the Z direction is large. Additionally, an interval in the Y-direction between the first principal plane side highly doped regions 10d adjacent in the Y direction is 100 μm to 900 μm. The shape of each first principal plane side highly doped region 10d is not limited to the above shape, and may be, for example, a rectangular cross section. Additionally, the interval in the Y-direction between the first principal plane side highly doped regions 10d adjacent in the Y direction may be smaller than 100 μm, and may be larger than 900 μm.

On the first principal plane 10a of the wafer 10, the n-type laminated body 12 and the p-type laminated body 13 extending in the Y direction are formed adjacent to each other. The n-type laminated body 12 and the p-type laminated body 13 are formed in comb-shapes so as to correspond to the n-side electrode 14 and the p-side electrode 15, and are formed so as to be interposed between each other. That is, the n-type laminated body 12 has a base on the lower side in FIG. 1, and extends upward from the base, and the p-type laminated body 13 has a base on an upper side, and extends downward from the base. Therefore, first regions W1 where the n-type laminated body 12 is provided, and second regions W2 where the p-type laminated body 13 is provided, are alternately arrayed in the X direction on the first principal plane 10a. The n-type laminated body 12, and the p-type laminated body 13 are provided so as to be adjacent in a contact state in the X direction. In this embodiment, the whole of the first principal plane 10a is substantially covered by the n-type laminated body 12 and the p-type laminated body 13.

The n-type laminated body 12 is composed of a first i-type layer 12i formed on the first principal plane 10a, and a first conductivity type layer 12n formed on the first i-type layer 12i. The n-type laminated body 12 does not need to be composed of two layers, but may be composed of any number of layers. The n-type laminated body 12 only needs to have the nature of an n-type, and may not include the i-type layer. The first i-type layer 12i is composed of a substantially intrinsic amorphous semiconductor (an intrinsic semiconductor is also hereinafter referred to as an "i-type layer"). In this embodiment, the "amorphous semiconductor" includes a microcrystalline semiconductor. The microcrystalline semiconductor is a semiconductor obtained by depositing semiconductor crystals in the amorphous semiconductor.

The first i-type layer 12$i$ is composed of an i-type amorphous silicon containing hydrogen (H), and has a thickness of about several nm to 25 nm, for example. A method for forming the first i-type layer 12$i$ is not particularly limited, and this layer can be formed by a chemical vapor deposition (CVD) method such as a plasma CVD method. The first i-type layer 12$i$ is not limited to amorphous silicon, and only needs to be a film having a passivation function of a surface of the wafer 10. For example, for the first i-type layer 12$i$, a silicon oxide can be used in addition to i-type amorphous silicon.

The first conductivity type layer 12$n$ is composed of an amorphous semiconductor obtained by addition of an u-type dopant that is the same conductivity type as the wafer 10. The first conductivity type layer 12$n$ in this embodiment is composed of n-type amorphous silicon containing hydrogen. The first conductivity type layer 12$n$ has a thickness of about 2 nm to 50 nm, for example.

The first insulating layer 16 is formed on the n-type laminated body 12. The first insulating layer 16 is not provided in a third region W3 equivalent to the central part of each first region W in the X direction, but is provided in fourth regions W4 equivalent to both ends remaining in each third region W3. The width of each fourth region W4 where the first insulating layer 16 is formed is about ⅓ of the width of each first region W1, for example. The thickness of each third region W3 where the first insulating layer 16 is not provided is about ⅓ of the width of each first region W1, for example.

The first insulating layer 16 is formed by, for example, silicon oxide ($SiO_2$), silicon nitride (SiN), or silicon oxynitride (SiON). The first insulating layer 16 is desirably formed by silicon nitride, and preferably contains hydrogen.

The p-type laminated body 13 is formed in each second region W2 that is not provided with the n-type laminated body 12 in the first principal plane 10$a$, and on ends of the fourth regions W4 provided with the first insulating layer 16. Therefore, the n-type laminated body 12 is located on the lower side of the first insulating layer 16, the p-type laminated body 13 is located on the upper side of the first insulating layer 16, and ends of the p-type laminated body 13 and ends of the n-type laminated body 12 in the X direction are provided so as to overlap with each other in the Z direction.

The p-type laminated body 13 is composed of a second i-type layer 13$i$ formed on the first principal plane 10$a$, and a second conductivity type layer 13$p$ formed on the second i-type layer 13$i$. From this, the solar cell 70 becomes a back junction type photovoltaic device provided with the first conductivity type layer 12$n$ and the second conductivity type layer 13$p$ on the back surface 70$a$ side. The p-type laminated body 13 does not need to be composed of two layers, but may be composed of any number of layers. The p-type laminated body 13 only needs to have the nature of a p-type, and may not include the i-type layer. The second i-type layer 13$i$ is composed of i-type amorphous silicon containing hydrogen, and has a thickness of about several nm to 25 nm, for example. The second i-type layer 13$i$ is not limited to amorphous silicon, and only needs to be a film having a passivation function of a surface of the wafer 10. For example, for the second i-type layer 13$i$, a silicon oxide can be used in addition to i-type amorphous silicon.

The second conductivity type layer 13$p$ is composed of an amorphous semiconductor obtained by addition of a p-type dopant that is a different conductivity type from the wafer 10. The second conductivity type layer 13$p$ in this embodiment is composed of a p-type amorphous silicon containing hydrogen. The second conductivity type layer 13$p$ has a thickness of about 2 nm to 50 nm, for example.

The n-side electrode 14 that collects electrons is formed on the first conductivity type layer 12$n$. The p-side electrode 15 that collects positive holes is formed on the second conductivity type layer 13$p$. A groove 29 is formed over all facing portions of the n-side electrode 14 and the p-side electrode 15 between the n-side electrode 14 and the p-side electrode 15, and both electrodes are electrically insulated. In this embodiment, the n-side electrode 14 and the p-side electrode 15 are composed of a laminated body of four conductive layers from a first conductive layer 19$a$ to a fourth conductive layer 19$d$.

The first conductive layer 19$a$ is formed by, for example, a transparent conductive oxide (TCO) such as a tin oxide ($SnO_2$), a zinc oxide (ZnO), or an indium tin oxide (ITO). The first conductive layer 19$a$ in this embodiment is formed by an indium tin oxide, and has a thickness of about 50 nm to 100 nm, for example.

The second conductive layer 19$b$ to the fourth conductive layer 19$d$ are conductive materials containing metal such as copper (Cu), tin (Sn), gold (Au), and silver (Ag). In this embodiment, the second conductive layer 19$b$ and the third conductive layer 19$c$ are formed of copper, and the fourth conductive layer 19$d$ is formed of tin. The second conductive layer 19$b$ has a thickness of about 50 nm to 1000 nm. The third conductive layer 19$c$ has a thickness of about 10 µm to 20 µm, and the fourth conductive layer 19$d$ has a thickness of about 1 µm to 5 µm.

A method for forming the first conductive layer 19$a$ to the fourth conductive layer 19$d$ is not particularly limited, and the first conductive layer 19$a$ to the fourth conductive layer 19$d$ can be formed by for example, a thin film formation method such as a sputtering method and a chemical vapor deposition method (CVD), or a plating method. In this embodiment, the first conductive layer 19$a$ and the second conductive layer 19$b$ are formed by the thin film formation method, and the third conductive layer 19$c$ and the fourth conductive layer 19$d$ are formed by the plating method. The conductive layer does not need to be provided by four layers, and may be composed of at least one layer. The quality of material of the conductive layer is not limited to the materials described above.

The i-type layer 17$i$ is provided on the second principal plane 10$b$ of the wafer 10. The i-type layer 17$i$ is formed by i-type amorphous silicon containing hydrogen, and has a thickness of about several nm to 25 nm, for example. The i-type layer 17$i$ is not limited to amorphous silicon, and only needs to be a film having a passivation function of a surface of the wafer 10. For example, for the i-type layer 17$i$, a silicon oxide can be used in addition to i-type amorphous silicon.

The n-type layer 17$n$ is provided on the i-type layer 17$i$. The n-type layer 17$n$ is composed of an amorphous semiconductor obtained by addition of an n-type dopant that is the same conductivity type as the wafer 10. The n-type layer 17$n$ in this embodiment is composed of an n-type amorphous silicon containing hydrogen, and has a thickness of about 2 nm to 50 nm, for example. The n-type layer 17$n$ does not always need to be provided, and the second insulating layer 18 described below may be directly provided on the i-type layer 17$i$.

The second insulating layer 18 having functions as an antireflection film and a protective film is provided on the n-type layer 17n. The second insulating layer 18 is formed of; for example, silicon oxide, silicon nitride, or silicon oxynitride. The thickness of the second insulating layer 18 is appropriately set in accordance with an antireflection characteristic as the antireflection film or the like, and is, for example, about 80 nm to 1000 nm.

Now, a method for manufacturing the solar cell 70 of this embodiment will be described with reference to FIG. 3 to FIG. 22.

Figure 3:
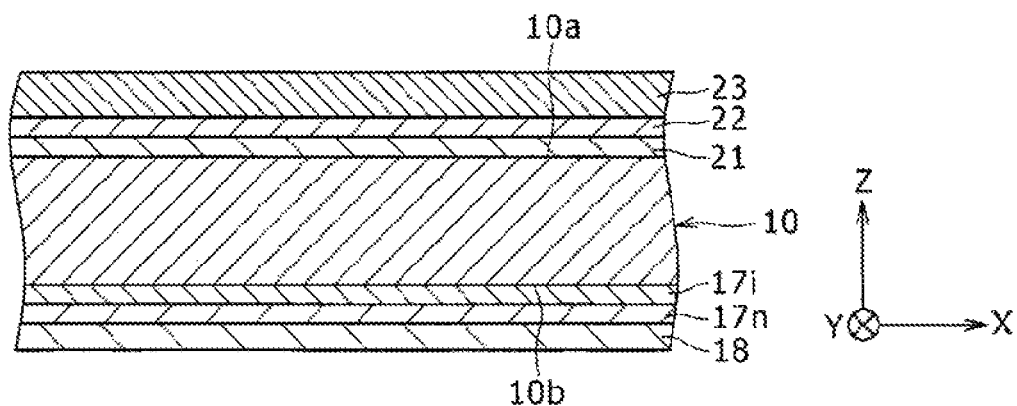
FIG. 3 is a sectional view for illustrating a manufacturing process of the solar cell.

First, as illustrated in FIG. 3, an i-type amorphous semiconductor layer 21, an n-type amorphous semiconductor layer 22, and an insulating layer 23 are formed on the first principal plane 10a of the wafer 10. The i-type layer 17i, the n-type layer 17n, and the second insulating layer 18 are formed on the second principal plane 10b of the wafer 10. Respective formation methods of the i-type amorphous semiconductor layer 21, the n-type amorphous semiconductor layer 22, the insulating layer 23, the i-type layer 17i, the n-type layer 17n, and the second insulating layer 18 are not particularly limited, and each of the layers can be formed by, for example, a chemical vapor deposition (CVD) method such as a plasma CVD method, or a sputtering method.

The order of forming the respective layers on the first principal plane 10a and the second principal plane 10b of the wafer 10 can be appropriately set. In this embodiment, in respective processes of forming the i-type amorphous semiconductor layer 21, the n-type amorphous semiconductor layer 22, and the insulating layer 23 on the first principal plane 10a, the i-type amorphous semiconductor layer that becomes the i-type layer 17i, the n-type amorphous semiconductor layer that becomes the n-type layer 17n, and the insulating layer that becomes the second insulating layer 18 are formed on the second principal plane 10b.

Figure 4:
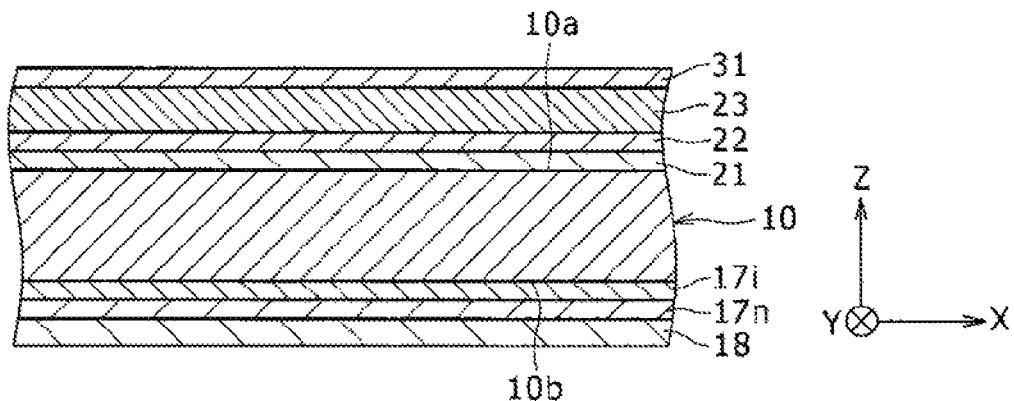
FIG. 4 is a sectional view for illustrating a manufacturing process of the solar cell.

As illustrated in FIG. 4, a first mask layer 31 is formed on the insulating layer 23. The first mask layer 31 is a layer that becomes a mask for patterning the i-type amorphous semiconductor layer 21, the n-type amorphous semiconductor layer 22 and the insulating layer 23. The first mask layer 31 is made of a material used for a semiconductor layer or an insulating layer of the solar cell 70, and is made of a material having lower alkali resistance than the insulating layer 23. The insulating layer 23 is made of a material containing silicon such as amorphous silicon, silicon nitride having a high silicon content, silicon containing oxygen, and silicon containing carbon (C). The first mask layer 31 desirably uses amorphous silicon, and the first mask layer 31 in this embodiment is composed of an i-type amorphous silicon layer. The first mask layer 31 is formed thin so as to be easily removed by a laser irradiation process described below in FIG. 5, and has a thickness of about 2 nm to 50 nm, for example.

Figure 5:
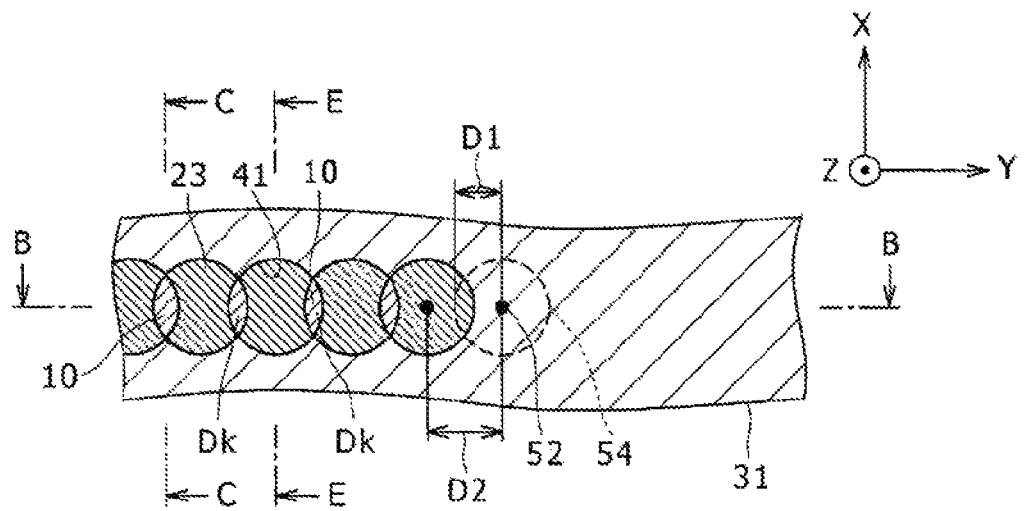
FIG. 5 is a plan view for illustrating a manufacturing process of the solar cell.

FIG. 5 is a plan view of the first mask layer 31 being subjected to laser irradiation as viewed from above the first mask layer 3. The first mask layer 31 is irradiated with a laser from above a paper surface of FIG. 5, and a part of the first mask layer 31 is removed by this irradiation. A region corresponding to each second region W2 (refer to FIG. 2) where the p-type laminated body 13 is provided is irradiated with a laser The laser irradiation is performed such that laser irradiation ranges 54 at irradiation positions adjacent in the Y direction as viewed from the Z direction partially overlap with each other, and is performed such that a center 52 of each laser subsequently emitted is not located in a range where the insulating layer 23 is exposed by removal of the first mask layer 31 by the previous laser irradiation. That is, laser irradiation is performed such that a radius D1 of each irradiation range 54 where the first mask layer 31 is removed by the laser irradiation is larger than an interval D2 of the adjacent laser irradiation. In addition, a plurality of overlapping regions Dk in the laser irradiation ranges 54 generated by emission of a plurality of lasers are arranged at intervals in the Y direction. By irradiation of suitable lasers with suitable laser intensity, in the overlapping regions Dk of the laser irradiation, the insulating layer 23, the n-type amorphous semiconductor layer 22, and the i-type amorphous semiconductor layer 21 are also removed in addition to the removal of the first mask layer 31, and the wafer 10 is exposed in the Z direction.

In order to reduce thermal effect to laser irradiation parts, the lasers are each desirably a short pulse laser whose pulse width is about a nanosecond (ns) or about a picosecond (ps). As such a laser, a YAG laser, an excimer laser, or the like may be used. In this embodiment, a third higher harmonic (wavelength: 355 nm) of a Nd:YAG laser (wavelength: 1064 nm) is used as a laser light source, and laser irradiation is performed with an intensity of about 0.1 to 0.5 $J/cm^2$ per pulse. A laser light source having a high repetition frequency is desirably used so as to perform removal by lasers for a short time.

Now, a process of removing respective layers 21 to 23, and 31 by laser irradiation will be described with reference to FIG. 6 to FIG. 9. FIG. 6 to FIG. 9 are sectional views corresponding to a B-B line cross section of FIG. 5, illustrating a state of the solar cell 70 in the middle of the manufacturing from before the laser irradiation to termination of the laser irradiation process in a time series manner.

Figure 6:
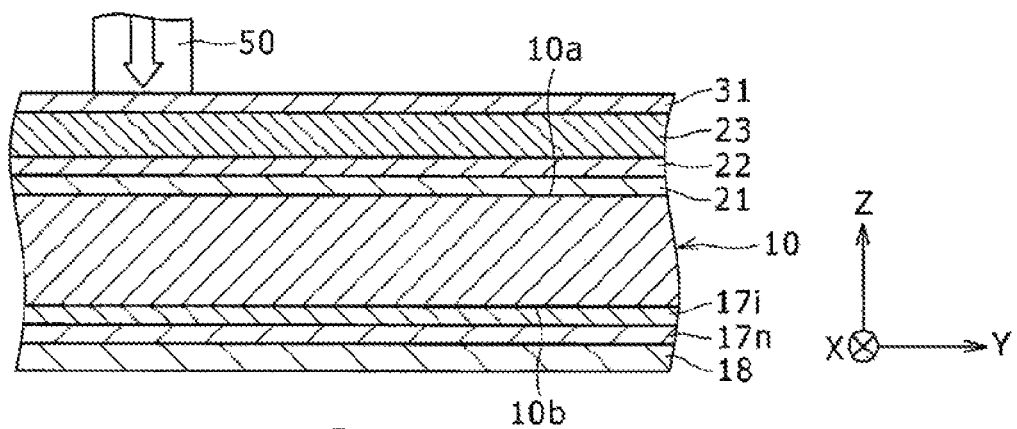
FIG. 6 is a sectional view for illustrating a manufacturing process of the solar cell.
Figure 7:
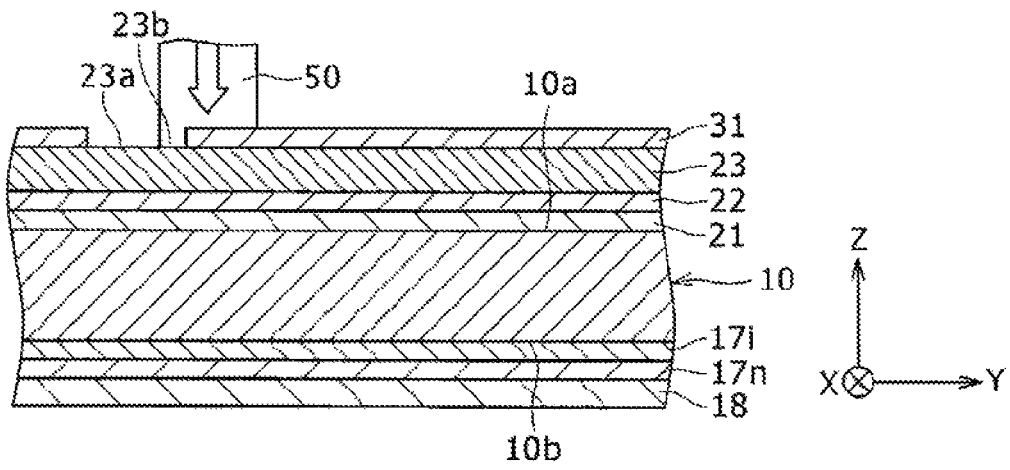
FIG. 7 is a sectional view for illustrating a manufacturing process of the solar cell.
Figure 8:
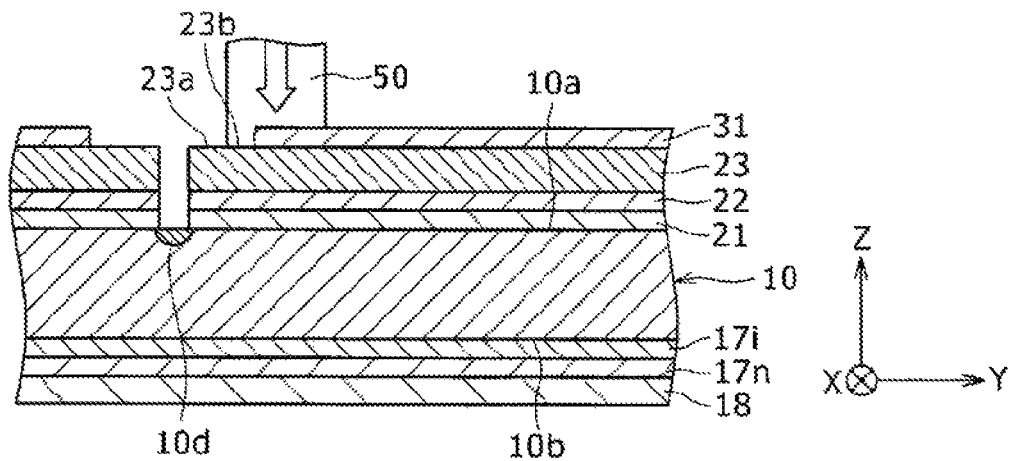
FIG. 8 is a sectional view for illustrating a manufacturing process of the solar cell.

First, as illustrated in FIG. 6, the first mask layer 31 is irradiated with a first shot laser 50, so that the first mask layer 31 in a region irradiated with the first shot laser 50 is removed, and the insulating layer 23 is exposed. As illustrated in FIG. 7, the first mask layer 31 is irradiated with a second shot laser 50 so as to overlap with one part 23b of an insulating layer exposed part 23a in the Z direction. The irradiation of the second shot laser 50 is performed in a state where the irradiation position is deviated from the first shot laser 50 in the Y direction. As illustrated in FIG. 8, in a region which overlaps with the one part 23b of the insulating layer exposed part 23a in the Z direction, the insulating layer 23, the n-type amorphous semiconductor layer 22, and the i-type amorphous semiconductor layer 21 are removed by the irradiation of the second shot laser 50.

That is, the first principal plane 10a of the wafer 10 in a spindle-shaped region where two circles resulting from irradiation of the laser 50 twice overlap, is exposed. Then, an n-type impurity of the n-type amorphous semiconductor layer 22 is doped in the first principal surface 10a of the wafer 10, so that the first principal plane side highly doped region 10d is formed. That is, the n-type dopant (for example, phosphorus, arsenic, antimony) in the n-type amorphous semiconductor layer 22 is diffused in a first principal plane side region of the wafer 10. As a result, as illustrated in FIG. 8, the first principal plane side highly doped regions 10d are formed on the first principal plane 10a side of the wafer 10. On the other hand, in a region irradiated with the laser 50 for the first time in the irradiation of the second shot laser 50, a portion of the first mask layer 31 is removed, and the insulating layer 23 is exposed.

Then, as illustrated in FIG. 8, irradiation of the first mask layer 31 with a third shot laser 50 is performed so as to overlap, in the Z direction, with the one part 23b of the insulating layer exposed part 23a of the insulating layer 23 exposed by the irradiation of the second shot laser 50. The irradiation of the third shot laser 50 is performed in a state where the irradiation position is deviated from the second shot laser 50 in the Y direction. In a region which overlaps, in the Z direction, with the one part of the insulating layer exposed part 23*a* exposed by the irradiation of the second shot laser 50, the insulating layer 23, the n-type amorphous semiconductor layer 22, and the i-type amorphous semiconductor layer 21 are removed by the irradiation of the third shot laser 50. When the layers 21 to 23 are removed by the irradiation of the third shot laser 50, an n-type dopant in the n-type amorphous semiconductor layer 22 is diffused in a first principal plane side region of the wafer 10 which overlaps with the one part 23*b* in the Z direction. As a result, a new first principal plane side highly doped region 10*d* is formed on the first principal plane side of the wafer 10. On the other hand, in a region irradiated with the laser 50 for the first time in the irradiation of the third shot laser 50, a portion of the first mask layer 31 is removed, and the insulating layer 23 is exposed.

Figure 9:
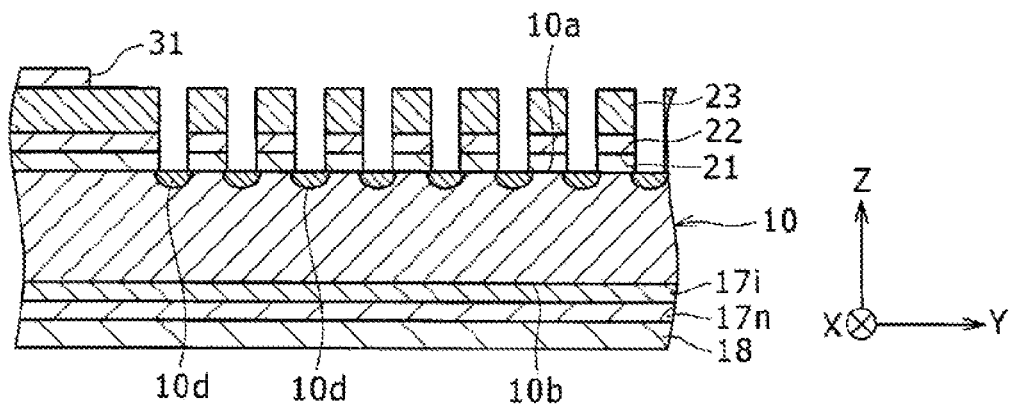
FIG. 9 is a sectional view for illustrating a manufacturing process of the solar cell.

Hereinafter, this process is repeated until the laser irradiation process is terminated, and as illustrated in FIG. 9, the plurality of first principal plane side highly doped regions 10*d* arranged at the intervals in the Y direction are formed on the first principal plane 10*a* side of the wafer 10.

Figure 10:
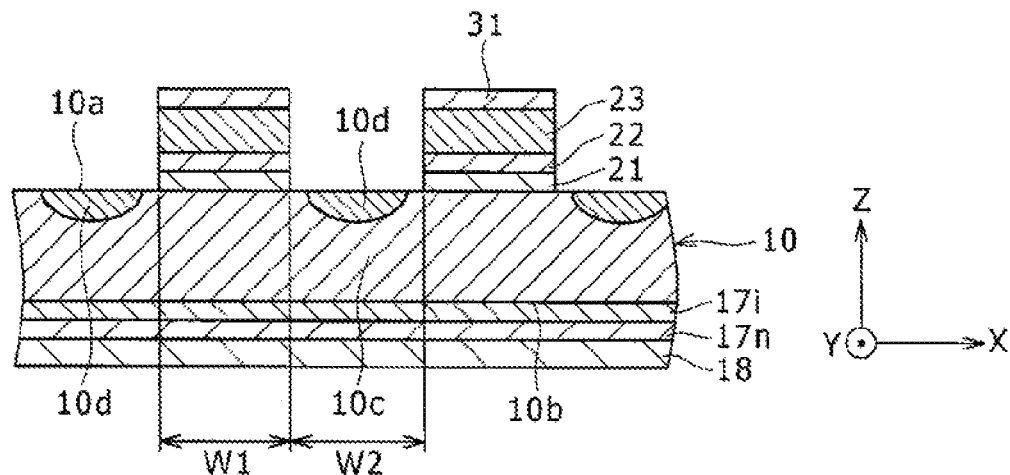
FIG. 10 is a sectional view for illustrating a manufacturing process of the solar cell.
Figure 11:
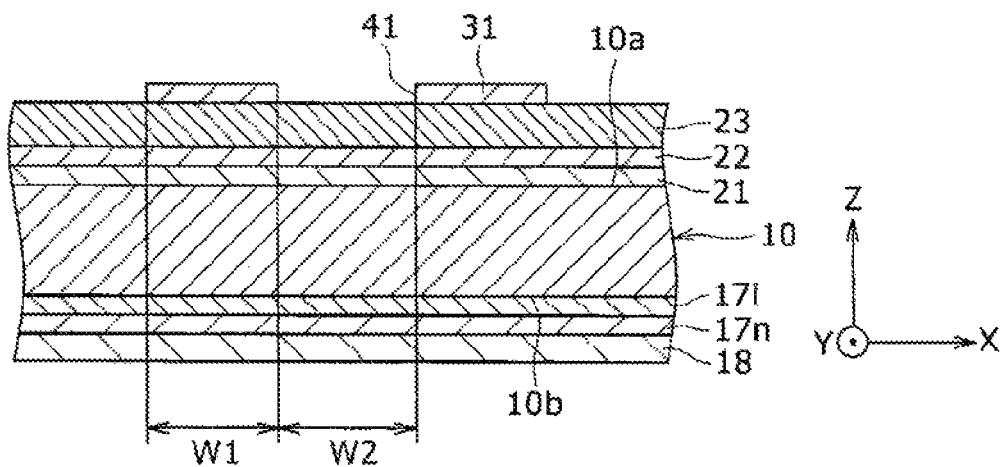
FIG. 11 is a sectional view for illustrating a manufacturing process of the solar cell.
Figure 12:
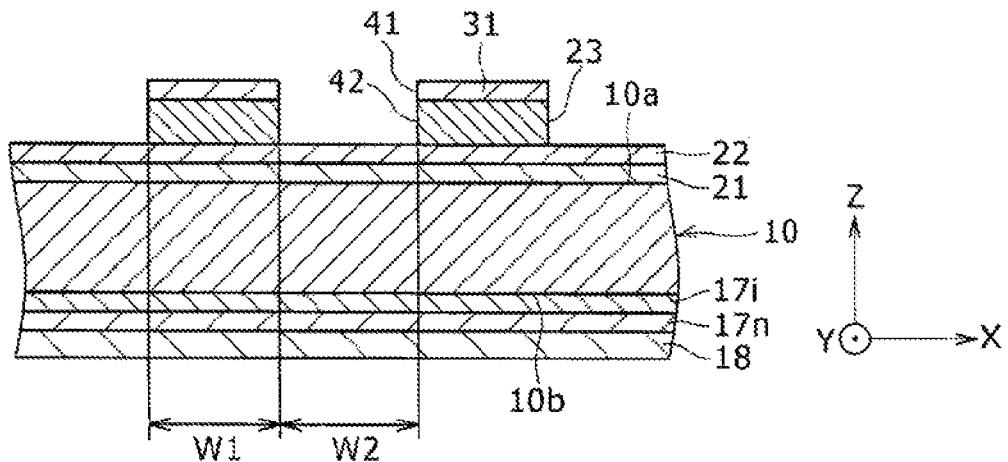
FIG. 12 is a sectional view for illustrating a manufacturing process of the solar cell.

FIG. 10 is a sectional view taken along a C-C line of FIG. 5, and is a sectional view passing through the overlapping regions Dk of the laser irradiation regions adjacent in the Y direction. FIG. 11 is a sectional view taken along an E-E line of FIG. 5, and is a sectional view passing through regions where the laser irradiation regions adjacent in the Y direction do not overlap (hereinafter, referred to as regions where the irradiation regions do not overlap). FIG. 12 is a sectional view corresponding to FIG. 11, illustrating a state where the insulating layer 23 is removed in a region where the first mask layer 31 does not exist.

As illustrated in FIG. 10, in a cross section including the X direction, the first principal plane side highly doped regions 10*d* are formed in regions overlapping, in the Z direction, with the second regions W2 where the p-type laminated body 13 is in contact with the wafer 10. On the other hand, as illustrated in FIG. 11, in the regions where the irradiation regions do not overlap, a plurality of regions where the first mask layer 31 is removed are provided at intervals in the X direction, and the insulating layer 23 is discretely exposed through first openings 41.

As illustrated in FIG. 12, in the regions where the laser irradiation regions do not overlap, the insulating layer 23 exposed in the first openings 41 is etched by using the first mask layer 31 patterned by laser irradiation. In a case where the insulating layer 23 is made of silicon oxide, silicon nitride, or silicon oxynitride, the etching of the insulating layer 23 can be performed by using an acid etching agent such as a hydrofluoric acid aqueous solution, for example. The etching agent used in chemical etching may be liquid or may be gas. Second openings 42 that expose the n-type amorphous semiconductor layer 22 are formed by etching of the insulating layer 23 located in the second regions W2.

Figure 13:
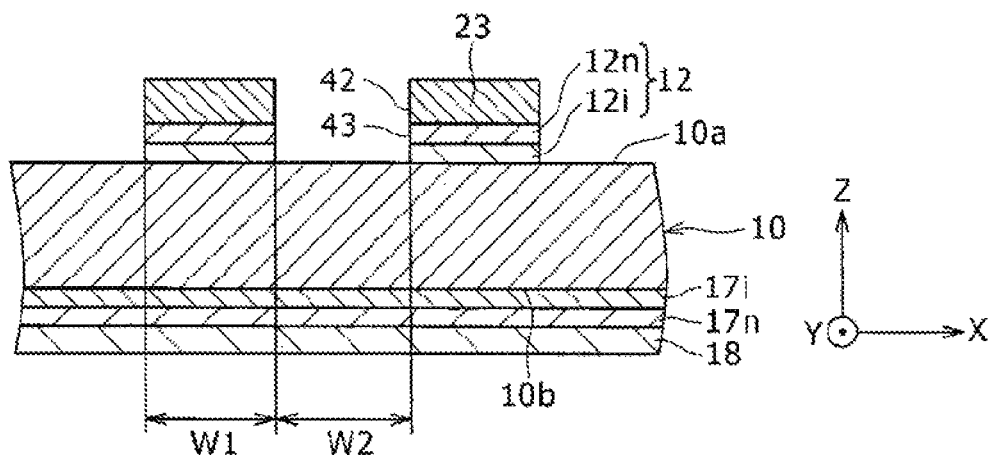
FIG. 13 is a sectional view for illustrating a manufacturing process of the solar cell.

The i-type amorphous semiconductor layer 21 and the n-type amorphous semiconductor layer 22 are etched by using the patterned insulating layer 23 as a mask. That is, in the regions where the laser irradiation regions do not overlap, as illustrated in FIG. 13, that is, the sectional view corresponding to FIG. 12, the i-type amorphous semiconductor layer 21 and the n-type amorphous semiconductor layer 22 are etched by using an alkaline etching agent. The i-type amorphous semiconductor layer 21 and the n-type amorphous semiconductor layer 22 located in the second regions W2 are removed, so that third openings 43 that expose the first principal plane 10*a* of the wafer 10 are formed. The i-type amorphous semiconductor layer 21 and the n-type amorphous semiconductor layer 22 that remain in the first regions W1 form the n-type laminated body 12. The first mask layer 31 on the insulating layer 23 is simultaneously removed in the etching process of the i-type amorphous semiconductor layer 21 and the n-type amorphous semiconductor layer 22. The second openings 42 and the third openings 43 formed after the etching process form integral grooves each having the first principal plane 10*a* of the wafer 10 as a bottom surface.

Figure 14:
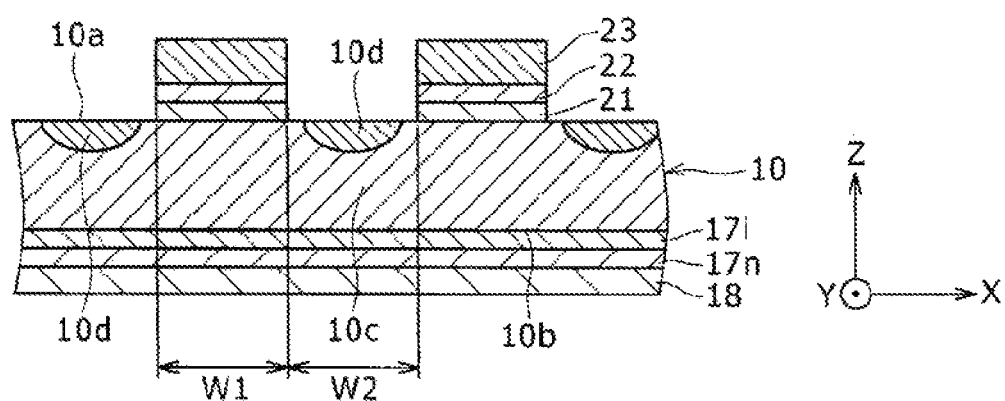
FIG. 14 is a sectional view for illustrating a manufacturing process of the solar cell.
Figure 15:
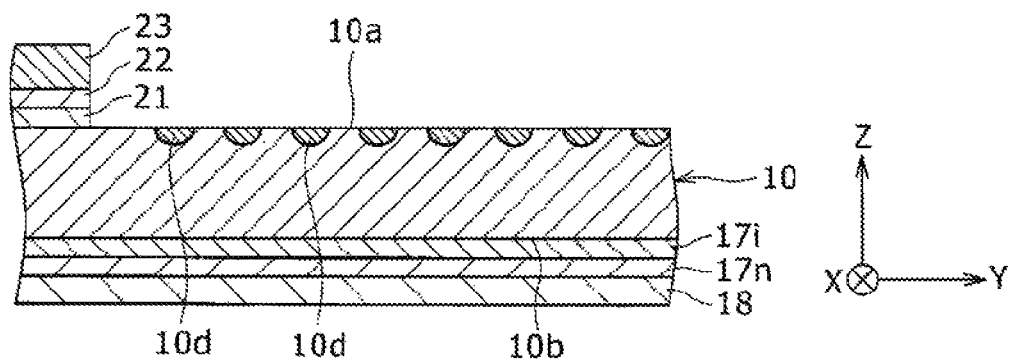
FIG. 15 is a sectional view for illustrating a manufacturing process of the solar cell.

In addition, as illustrated in FIG. 14, that is, the sectional view corresponding to FIG. 10, the first mask layer 31 on the insulating layer 23 is removed also in the regions where the irradiation regions overlap, by this etching. As illustrated in FIG. 15, that is, the sectional view corresponding to FIG. 9, the layers 21 to 23 between the first principal plane side highly doped regions 10*d* adjacent in the Y direction are removed by a series of the etching steps at this time.

Figure 16:
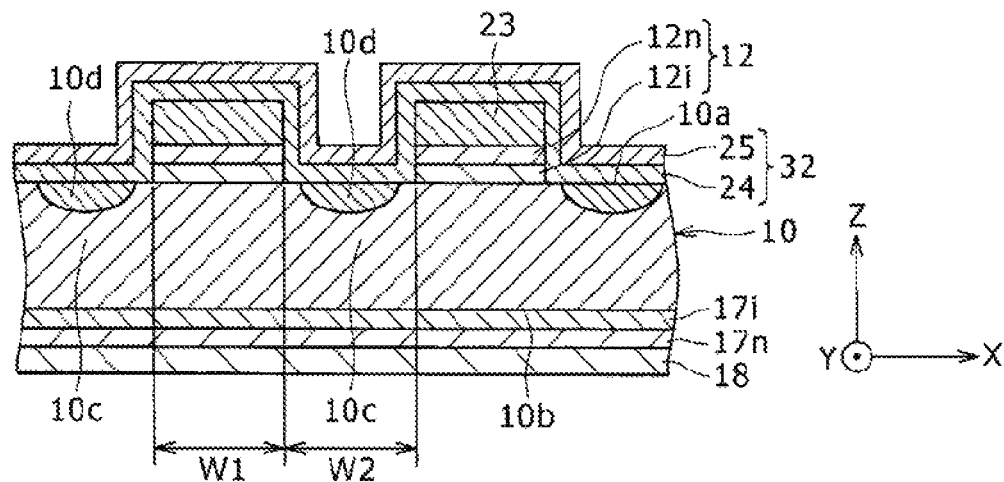
FIG. 16 is a sectional view for illustrating a manufacturing process of the solar cell.
Figure 17:
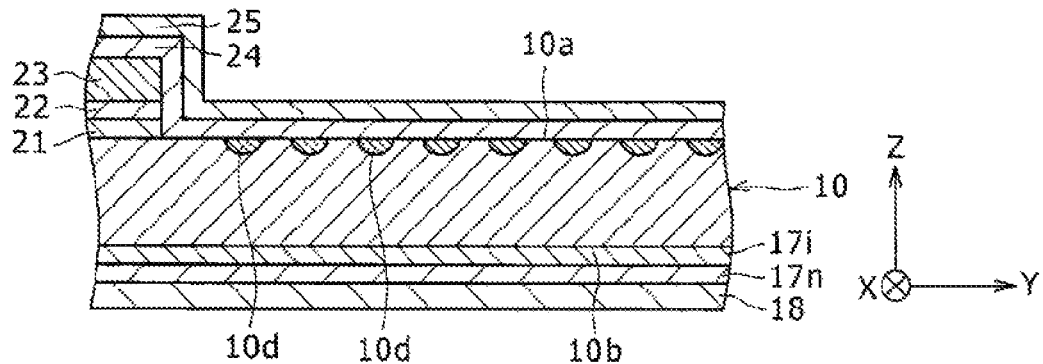
FIG. 17 is a sectional view for illustrating a manufacturing process of the solar cell.

As illustrated in FIG. 16, that is, the sectional view corresponding to FIG. 14, in the regions where the irradiation regions overlap, an i-type amorphous semiconductor layer 24 is formed so as to cover the first principal plane 10*a* and the insulating layer 23, and a p-type amorphous semiconductor layer 25 is formed on the i-type amorphous semiconductor layer 24. As illustrated in FIG. 17, that is, the sectional view corresponding to FIG. 15, in a cross section including the Y direction and the Z direction, the i-type amorphous semiconductor layer 24 and the p-type amorphous semiconductor layer 25 extending in the Y direction are provided so as to cover the first principal plane side highly doped regions 10*d* at this time.

FIG. 16 and subsequent figures each illustrate only a sectional view of the regions where the irradiation regions overlap, corresponding to FIG. 14, and illustration of the sectional view of the regions where the irradiation regions do not overlap, corresponding to FIG. 13, is omitted. The sectional view of the regions where the irradiation regions do not overlap, corresponding to FIG. 13, is different from the sectional view of the regions where the irradiation regions overlap only in that the first principal plane side highly doped regions 10*d* do not exist.

The respective methods of the i-type amorphous semiconductor layer 24, and the p-type amorphous semiconductor layer 25 are not particularly limited, and these layers can be formed by, for example, a thin film formation method such as a CVD method. The i-type amorphous semiconductor layer 24 and the p-type amorphous semiconductor layer 25 function as a second mask layer 32 for further patterning the insulating layer 23.

Figure 18:
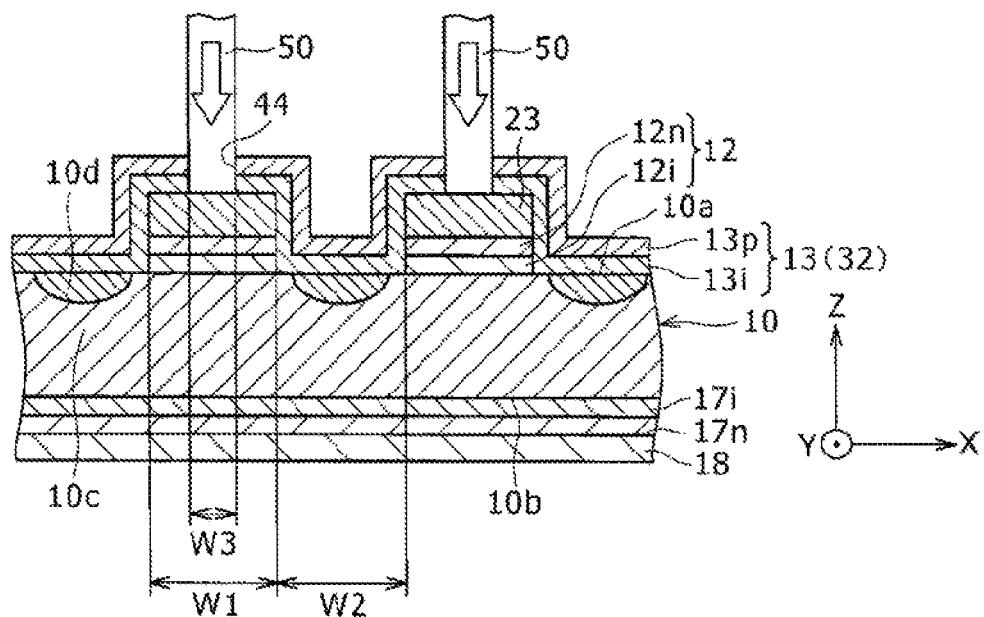
FIG. 18 is a sectional view for illustrating a manufacturing process of the solar cell.

As illustrated in FIG. 18, a part of the second mask layer 32 located on the insulating layer 23 in the first regions W1 is irradiated with the lasers 50. In the third regions W3 irradiated with the lasers 50, fourth openings 44 that expose the insulating layer 23 are formed. The i-type amorphous semiconductor layer 24 in a portion of the second mask layer 32 in a region other than the third regions W3 remains after the laser irradiation to become the second i-type layer 13*i*, and the p-type amorphous semiconductor layer 25 becomes the second conductivity type layer 13*p*. That is, the p-type laminated body 13 is formed from the second mask layer 32.

Figure 19:
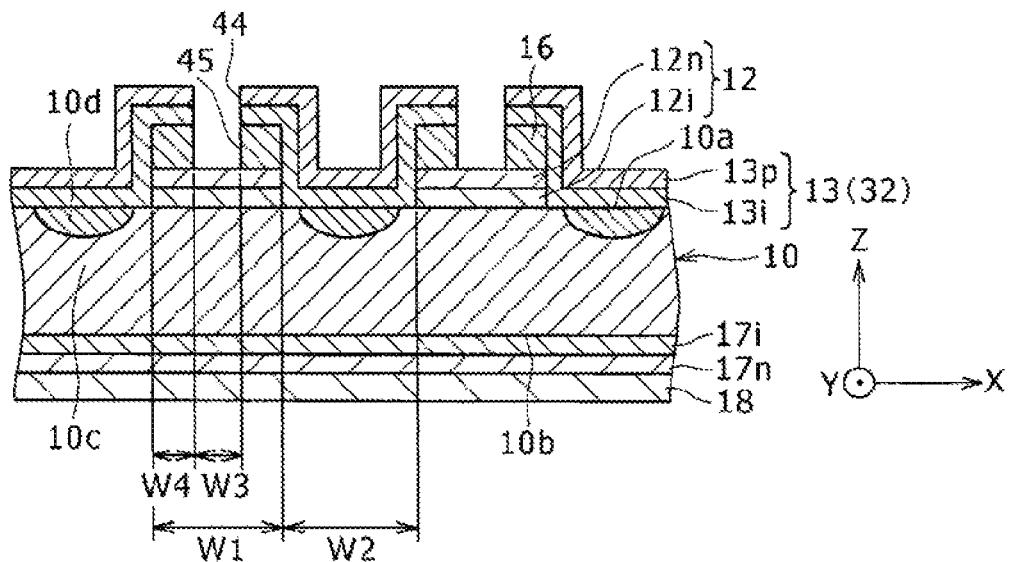
FIG. 19 is a sectional view for illustrating a manufacturing process of the solar cell.

As illustrated in FIG. 19, etching of the insulating layer 23 exposed in the fourth openings 44 is performed by using the patterned second mask layer 32. The etching of the insulating layer 23 can be performed by an acid etching agent such as a hydrofluoric acid aqueous solution similarly to the above process illustrated in FIG. 12. Consequently, fifth openings 45 are formed in the insulating layer 23 to expose the first conductivity type layer 12n, and form the first insulating layer 16 from the insulating layer 23. Portions formed by removing the insulating layer 23 become the third regions W3, and portions including the remaining first insulating layer 16 become the fourth regions W4. The fourth openings 44 and the fifth openings 45 formed after the etching process form integral grooves each having a surface of the first conductivity type layer 12n as a bottom surface.

Figure 20:
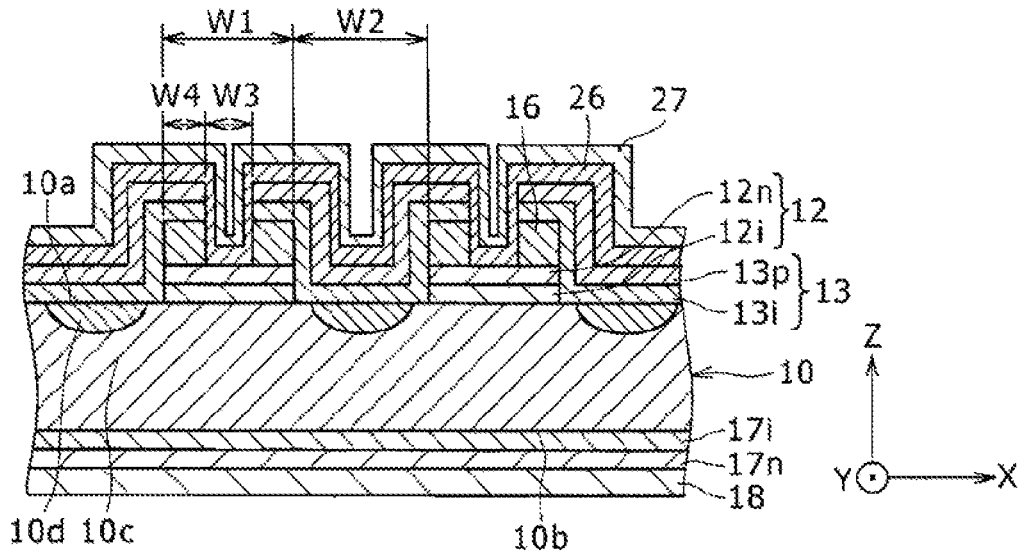
FIG. 20 is a sectional view for illustrating a manufacturing process of the solar cell.

As illustrated in FIG. 20, conductive layers 26, 27 are formed on the first conductivity type layer 12n and the second conductivity type layer 13p. The conductive layer 26 is a transparent electrode layer of an indium tin oxide (ITO) or the like, and the conductive layer 27 is a metal electrode layer made of metal such as copper (Cu), or alloy. The conductive layers 26, 27 are formed by a CVD method such as a plasma CVD method, or a thin film formation method such as a sputtering method.

Figure 21:
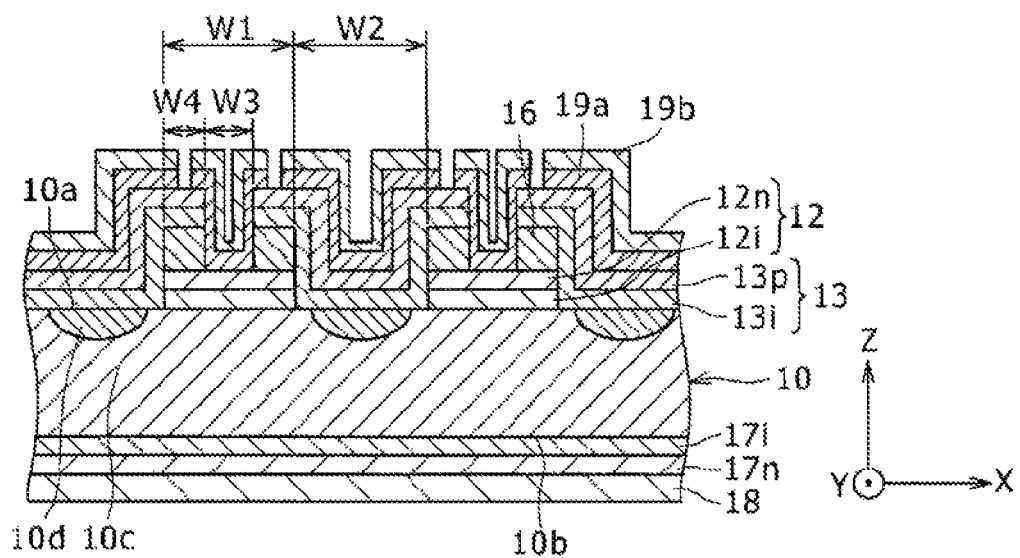
FIG. 21 is a sectional view for illustrating a manufacturing process of the solar cell.

As illustrated in FIG. 21, portions located on the first insulating layer 16 in the conductive layers 26, 27 are divided to form grooves. Consequently, the first conductive layer 19a and the second conductive layer 19b are formed from the conductive layers 26, 27, and the n-type electrode and the p-side electrode are divided. The division of the conductive layers 26, 27 can be performed by, for example, wet etching or laser irradiation.

Finally, the third conductive layer 19c containing, for example, copper (Cu), and the fourth conductive layer 19d containing, for example, tin (Sn) are formed on the first conductive layer 19a and the second conductive layer 19b by a plating method. With the manufacturing processes thus described, the solar cell 70 illustrated in FIG. 2 is completed.

According to the above embodiment, in the n-type wafer 10, the first principal plane side highly doped regions 10d are provided between the n-type doped lightly doped region 10c and the p-type laminated body 13. The first principal plane side highly doped regions 10d have higher n-type dopant concentration than the lightly doped region 10c, and are provided between the lightly doped region 10c and the p-type laminated body 13. Therefore, in the regions where the first principal plane side highly doped regions 10d exist, the width of a depletion layer generated near a p-n junction boundary can be narrowed, and electrons easily pass through the depletion layer, and a reverse bias voltage can be reduced. Accordingly, it is possible to reduce heat generation when the solar cell 70 is shaded, and it is possible to suppress deterioration of the solar cell 70.

The first principal plane side highly doped region 10d does not continuously extend in the Y direction along the p-type laminated body 13, and the plurality of first principal plane side highly doped regions 10d are discretely provided at intervals in the Y direction. Therefore, regions where electrons and positive holes generated near the p-n junction boundary by energy of light easily disappear are limited to discrete portions, and a power generation characteristic is not greatly lowered.

As a result, it is possible to suppress a reverse bias voltage generated when the solar cell is shaded, and it is possible to implement the solar cell 70 whose power generation characteristic is unlikely to be lowered.

Particularly, in this embodiment, as illustrated in FIG. 5, a moving amount of laser irradiation is adjusted, so that twice irradiated regions are created, and these twice irradiated regions are doped with a high concentration impurity, and the first principal plane side highly doped regions 10d are formed. Accordingly, it is possible to easily manufacture the first principal plane side highly doped regions 10d by using lasers. Therefore, it is possible to reduce the number of manufacturing processes, and it is possible to reduce manufacturing cost.

The present invention is not limited to the above embodiment and a modification of the embodiment, and various modifications and improvements can be performed in the matters recited in the scope of the claims and in an equivalent scope thereof.

For example, in the above embodiment, the method for forming the first principal plane side highly doped regions 10d by laser irradiation is described. However, the first principal plane side highly doped regions 10d may be formed by annealing treatment after dopant atoms such as phosphorus, arsenic, antimony, boron, and gallium have been implanted into a wafer by ion implantation, or may be formed by an impurity diffusing method using a high-temp-furnace, or the like. The first principal plane side highly doped regions 10d may be formed by any method other than the method using laser irradiation. That is, an impurity is doped into the first principal plane side highly doped regions 10d in order to form the first principal plane side highly doped regions 10d, and therefore various methods can be employed. The impurity may be doped after the first principal plane 10a is exposed by a laser, or the impurity may be doped after a desired portion of the first principal plane 10a has been exposed by another method. Alternatively, the impurity may be doped in the first principal plane side highly doped regions 10d by implanting ions having predetermined energy into the first principal plane side highly doped regions 10d without exposing the first principal plane 10a.

As illustrated in FIG. 1, a case where the plurality of first principal plane side highly doped regions 10d are arranged at equal intervals in the Y direction is described. However, the plurality of first principal plane side highly doped regions may be arranged at non-uniform intervals in the Y direction. This modification can be easily implemented by, for example, providing a case where dopant atoms are not diffused in the wafer even in the laser overlapping regions Dk by changing the intensity of a laser every shot.

As illustrated in FIG. 2, a case where the first principal plane side highly doped regions 10d are not provided in the whole ranges of the second regions W2 where the p-type laminated body 13 is in contact with the wafer 10, but provided in only the central parts of the second regions W2, is described. However, the first principal plane side highly doped regions 10d may be provided in the whole ranges of the second regions W2 where the p-type laminated body 13 is in contact with the wafer 10, and the length of each first principal plane side highly doped region 10d in the X direction may be made to substantially coincide with the length in the X direction of each contact region in contact with the wafer 10 in the p-type laminated body 13.

The overlapping regions Dk (refer to FIG. 5) in the laser irradiation ranges 54 are provided in the regions corresponding to the second regions W2 (refer to FIG. 2). Therefore, this modification can be implemented by suitably selecting the type and the intensity of a laser by the above method. According to this modification, the length of each first principal plane side highly doped region 10d in the X direction is increased, and therefore it is possible to increase a reducing effect of a reverse bias voltage.

REFERENCE SIGNS LIST 10 wafer
12 n-type laminated body 13 p-type laminated body
10c lightly doped region
10d first principal plane side highly doped region
70 solar cell

The invention claimed is:

1. A solar cell comprising:
a first conductive type silicon wafer;
a first conductive type amorphous silicon layer that is provided on a first side of the first conductive type silicon wafer, and extends in a first direction; and
a second conductive type amorphous silicon layer that is provided on the first principal plane side of the first conductive type silicon wafer so as to the adjacent to the first conductive type amorphous silicon layer in a second direction, and extends in the first direction, wherein
the first conductive type silicon wafer has:
a lightly doped region that is doped into a first conductivity type;
a plurality of first principal plane side highly doped regions each having higher dopant concentration of the first conductivity type than the lightly doped region, and being provided between the lightly doped region and the second conductive amorphous silicon layer at an interval in the first direction and in a normal direction of the first principle plane side,
wherein none of the plurality of first principal plane side highly doped regions are between the lightly doped region and the first conductive type amorphous silicon layer in the normal direction of the first principal plane side; and
wherein the second conductive type is opposite the first conductive type.

2. The solar cell according to claim 1, wherein
in a cross section including the second direction, and a thickness direction of the first conductive silicon wafer, the first principal plane side highly doped regions are each provided in a region that overlaps, in the thickness direction, with a region where the second conductive amorphous silicon layer is in contact, with the first conductive silicon wafer, and each have a shape that is convex toward a second principal plane and having the largest thickness at a central part in the second direction.

3. The solar cell according to claim 1, wherein
a length of the second direction of a region in contact with the first conductive silicon wafer in the second conductive amorphous silicon layer substantially coincides with a length in the second direction of each of the first principal plane side highly doped regions.

4. The solar cell according to claim 1, wherein
an interval of the first principal plane side highly doped regions adjacent in the first direction is 100 μm to 900 μm.

5. The solar cell according to claim 1, wherein
dopant concentration of the lightly doped region is $1 \times 10^{15}/cm^3$ to $1 \times 10^{17}/cm^3$,
and dopant concentration of each of the first principal plane side highly doped regions is $1 \times 10^{18}/cm^3$ to $1 \times 10^{20}/cm^3$.

* * * * *